US005711808A

United States Patent [19]

Yang et al.

[11] Patent Number: 5,711,808

[45] Date of Patent: Jan. 27, 1998

[54] BOAT FOR VERTICAL DIFFUSION FURNACE

[75] Inventors: Jong-moon Yang, Suwon; Chung-hwan Kwon, Yongin,; Sang-woon Kim; Choung-bae Park, both of Suwon, all of Rep. of Korea

[73] Assignee: Samsung Electronics Co., Ltd., Rep. of Korea

[21] Appl. No.: 755,159

[22] Filed: Nov. 25, 1996

[30] Foreign Application Priority Data

Nov. 28, 1995 [KR] Rep. of Korea .................... 95-44267

[51] Int. Cl.[6] .................................... C23C 16/00

[52] U.S. Cl. .................................... 118/5; 118/728

[58] Field of Search ............................ 118/500, 728

[56] References Cited

U.S. PATENT DOCUMENTS

| | | | |
|---|---|---|---|
| 4,569,452 | 2/1986 | Schulke . | |
| 5,054,418 | 10/1991 | Thompson | 118/728 |
| 5,507,873 | 4/1996 | Ishizuka | 118/728 |
| 5,595,604 | 1/1997 | Kobayashi | 118/728 |

*Primary Examiner*—Richard Bueker

*Attorney, Agent, or Firm*—Jones & Volentine, LLP

[57] ABSTRACT

A boat for a vertical diffusion furnace has an upper disk and a lower disk spaced parallel from each other by a predetermined distance. A pair of first bars, having a plurality of wafer holding slots, face each other along a first center plane extending along a diameter of the upper and lower disks, and connect the upper and lower disks. A pair of second bars also connect the upper and lower disks, and are positioned at a predetermined angle with respect to a second center plane orthogonal to the first center plane. The second bars have a plurality of slots corresponding to the slots of the first bars. A pair of first auxiliary bars are installed adjacent to the pair of first bars to also connect the upper and lower disks. The boat may further have a pair of second auxiliary bars for connecting the upper and lower disks at positions adjacent to the pair of second bars. Also, a pair of horizontal supporting bars connect the first auxiliary bars to the second auxiliary bars. Therefore, thermal deformation of the first bars is markedly reduced, the slip of the wafers out of the slots is prevented, and the life of the boat can be longer.

13 Claims, 5 Drawing Sheets

BOAT FOR VERTICAL DIFFUSION FURNACE

BACKGROUND OF THE INVENTION

1. Field of the Invention

The present invention relates to a boat for a vertical diffusion furnace used for fabricating a semiconductor device, and more particularly, to a boat for a vertical diffusion furnace which can suppress boat-bar deformation caused by high-temperature heat treatment.

2. Description of the Related Art

Boats for containing a plurality of wafers in a stack are installed in a vertical diffusion furnace used to perform impurity diffusions on wafers through oxidation and annealing.

FIG. 1 is a plan view of a conventional boat for a vertical diffusion furnace, and FIG. 2 is a sectional view taken along line 2'—2' of FIG. 1. Referring to FIGS. 1 and 2, the conventional boat has an upper disk 11, a lower disk 12 spaced from the upper disk 11 by a predetermined distance, a pair of first bars 13 connecting the upper disk 11 to the lower disk 12 and spaced in a direction from a center plane C1 by a predetermined distance S, and a pair of second bars 14 connecting the upper disk 11 to the lower disk 12 at 30° with respect to another center plane C2 in portions of the upper and lower disks 11 and 12. As shown in FIG. 1, center planes C1 and C2 are perpendicular. Reference numeral 11*a* denotes a hole used to install the boat in the diffusion furnace.

Referring to FIGS. 2 and 3, a multitude of slots 14*a*, for example, 100 or more, are formed in each second bar 14 to support wafers W. Similarly, a multitude of slots 13*a* corresponding to the slots 14*a* of the second bar 14 are formed in each first bar 13.

FIG. 4 depicts a section of the first and second bars 13 and 14. Reference character D denotes the diameter of the first and second bars 13 and 14, reference character A denotes the depth of the slots 13*a* and 14*a*, and reference character B denotes the thickness of supporting portions 13*b* and 14*b*, of the first and second bars 13 and 14, for supporting the load of the wafers W. In the conventional boat, when the diameter of the wafers W is 200 mm, the diameter D of the bars 13 and 14 is 19 mm, the depth A of the slots 13*a* and 14*a* is 7.5 mm, and the thickness B of the supporting portions 13*b* and 14*b* is 11.5 mm.

FIG. 5 is a sectional view of the state where the wafer W is placed in the slot 13*a* of the first bar 13. In FIG. 5, reference character C denotes the depth of the wafer W inserted into the slot 13*a*. Reference character E denotes the distance between the wafer W and the wall of the slot 13*a*. In the case of a 200 mm wafer, when the first bar 13 has 7.5 mm deep slots, the insertion depth C of the wafer W is 5.5 mm and the distance E is 2 mm, before heat treatment of the wafer W.

In the conventional boat, however, the first bar 13 is thermally deformed outward as shown in FIG. 6 during the heat treatment of the wafer W. Such thermal deformation of the first bar 13 reduces the insertion depth C of the wafer W of FIG. 5 and could result in the wafer W slipping out of the slot 13*a*. Furthermore, frequent replacement of the boat is required as a result of the thermal deformation, thus increasing manufacturing costs.

A need exists, therefore, for a method to decrease the thermal deformation of the first bar 13, which is a serious drawback for conventional boats utilized in vertical diffusion furnaces.

SUMMARY OF THE INVENTION

Therefore, the object of the present invention is to provide a boat for a vertical diffusion furnace, which can prevent a wafer from slipping out of a slot and which can also last longer.

To achieve the above object, there is provided a boat for a vertical diffusion furnace, comprising: an upper disk and a lower disk spaced parallel from each other at a predetermined distance; a pair of first bars connecting the upper disk and the lower disk, each having a plurality of slots for receiving wafers, and being positioned at opposing ends of a first center plane extending along a diameter of the upper and lower disks; a pair of second bars connecting the upper disk and the lower disk, each having a plurality of slots corresponding to the slots of the first bars, and each being positioned at a predetermined angle with respect to a second center plane orthogonal to the first center plane; and a pair of first auxiliary bars connecting the upper and lower disks, each being positioned adjacent to respective of the pair of first bars.

Preferably, the boat is further provided with a pair of second auxiliary bars for connecting the upper and lower disks at positions adjacent to the second bars, and a pair of horizontal supporting bars for connecting the first auxiliary bars to the second auxiliary bars.

BRIEF DESCRIPTION OF THE DRAWINGS

The above object and advantages of the present invention will become more apparent by describing in detail a preferred embodiment thereof with reference to the attached drawings in which.

DETAILED DESCRIPTION OF THE INVENTION

Figure 7:
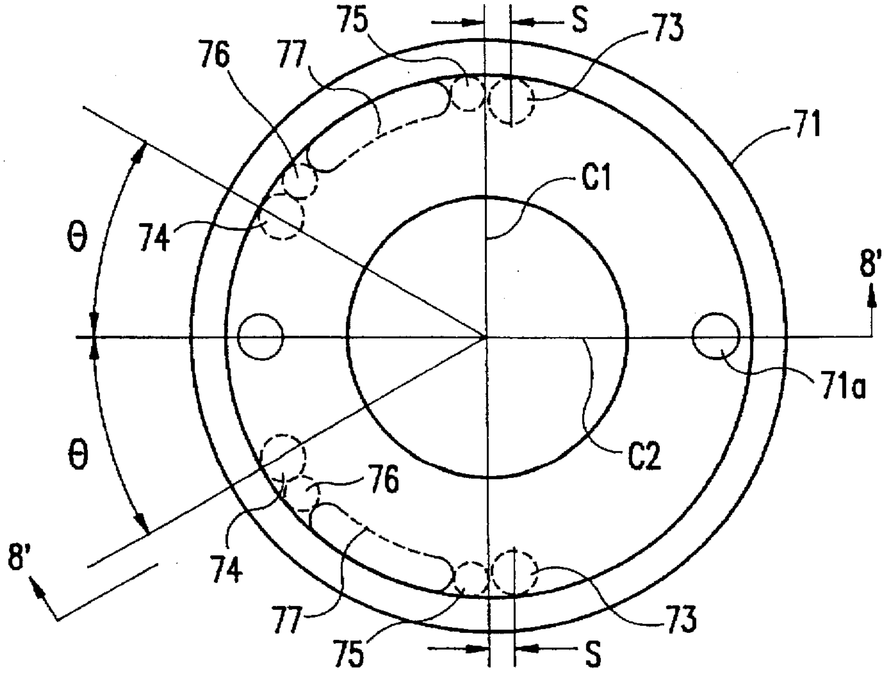
FIG. 7 is a schematic plan view of a boat for a vertical diffusion furnace according to the present invention.
Figure 8:
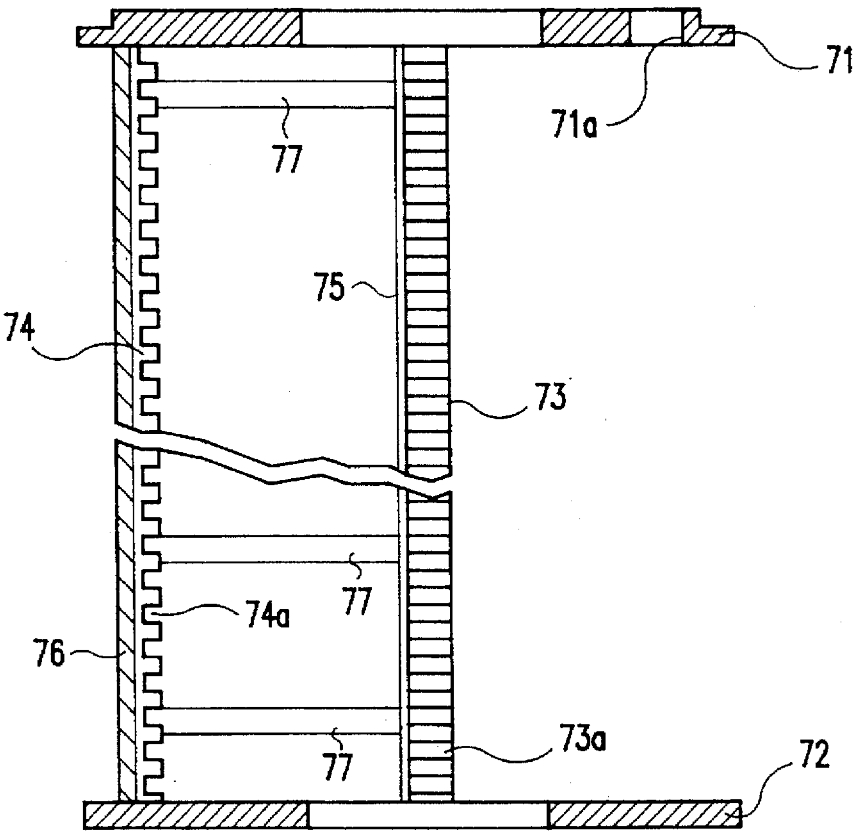
FIG. 8 is a sectional view of the boat taken along line 8'—8' of FIG. 7.

Referring to FIGS. 7 and 8, a boat for a vertical diffusion furnace according to the present invention has an upper disk 71, a lower disk 72 spaced from the upper disk 71 by a predetermined distance, a pair of first bars 73 connecting the upper and lower disks 71 and 72 and spaced in a direction from a center plane C1 by a predetermined distance S, and a pair of second bars 74 connecting the upper and lower disks 71 and 72 and formed at an angle θ with respect to another center plane C2 on portions of the upper and lower disks 71 and 72. Center planes C1 and C2 are perpendicular. A pair of first auxiliary bars 75 are installed adjacent to the first bars 73. Preferably, a pair of second auxiliary bars 76 are further installed adjacent to the second bars 74, for connecting the upper disk 71 to the lower disk 72. The first and second auxiliary bars 75 and 76 serve to alleviate the loads that would be concentrated on the first and second bars 73 and 74. Preferably, a pair of supporting bars 77 are further installed horizontally between the first and second auxiliary bars 75 and 76, to reduce the thermal deformation of the boat. Reference numeral 71*a* denotes a hole used to install the boat in the vertical diffusion furnace.

The angle θ is between 31° and 40°, and preferably 35°. That is, since the angle with respect to the center plane C2 increases by 1° to 10°, and preferably 5°, from that of the conventional boat, the load concentrated on the first bars 73 can be shared with the second bars 74.

Figure 1:
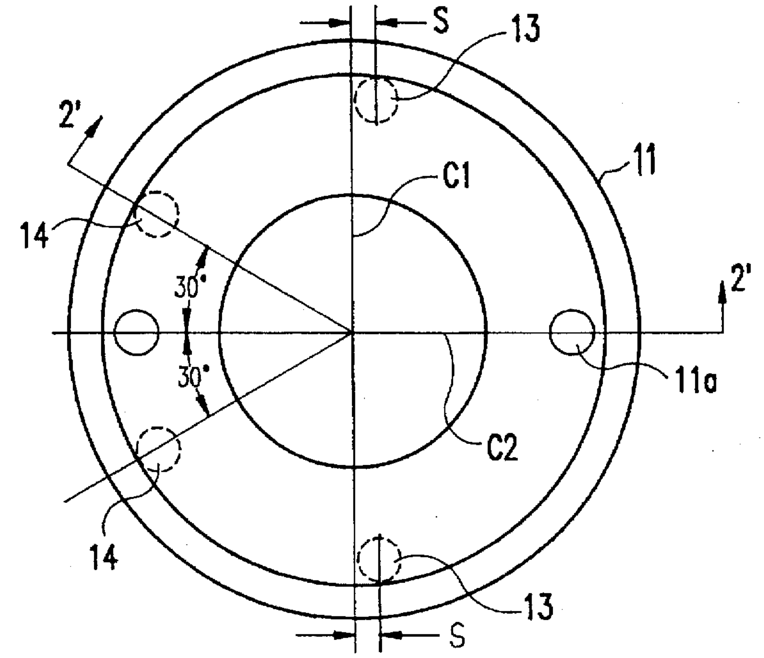
FIG.1 PRIOR ART
FIG. 1 is a schematic plan view of a conventional boat used for a vertical diffusion furnace.
Figure 2:
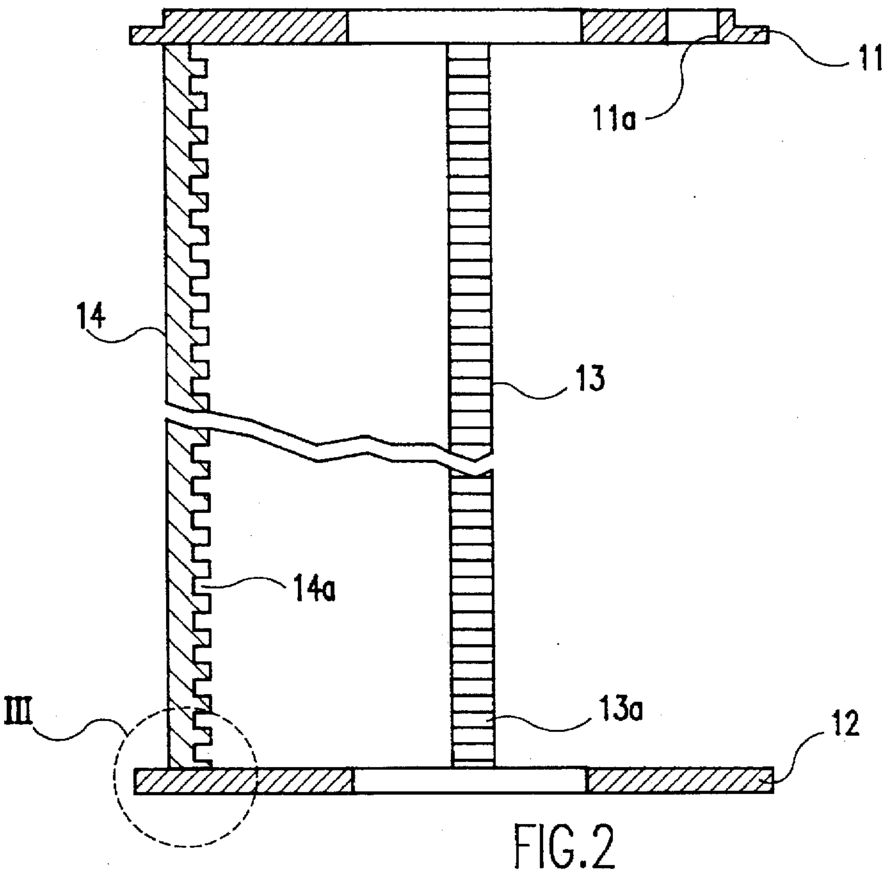
FIG.2 PRIOR ART
FIG. 2 is a sectional view of the conventional boat taken along line 2'—2' of FIG. 1.
Figure 3:
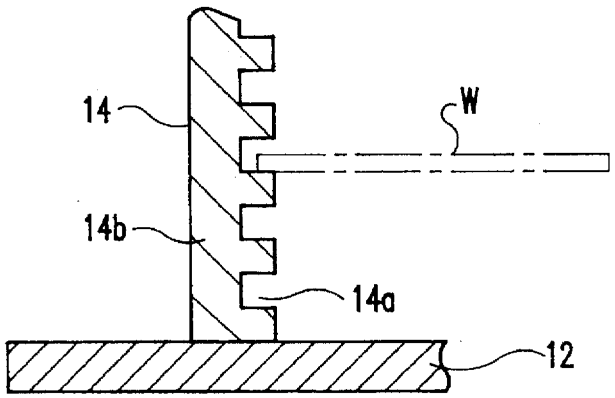
FIG.3 PRIOR ART
FIG. 3 is a magnified view of a portion III of FIG. 2.
Figure 4:
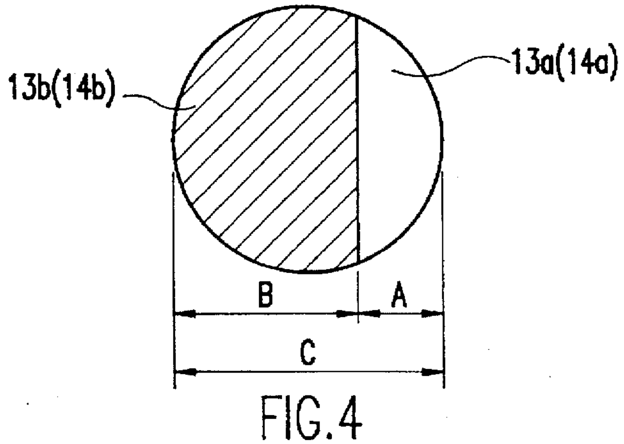
FIG.4 PRIOR ART
FIG. 4 is a sectional view of first and second bars used for the boat of FIG. 1.

Referring to FIG. 8, a multitude of slots 74*a*, for example, 100 or more, are formed in each second bar 74 to support wafers W (see FIG. 3). Similarly, each first bar 73 has a multitude of slots 73*a* corresponding to the slots 74*a* of the second bar 74.

Figure 9:
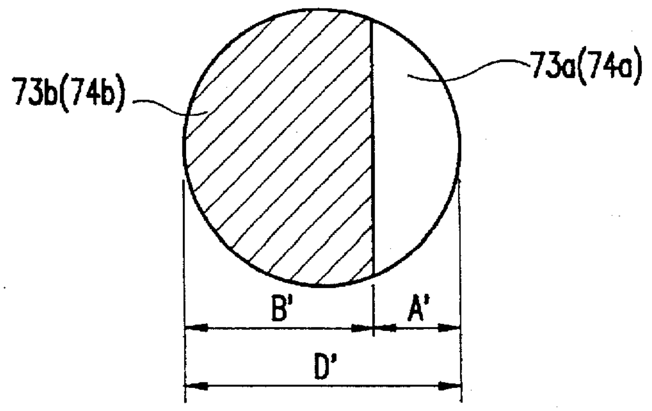
FIG. 9 is a sectional view of first and second bars used for the boat shown in FIG. 7.

FIG. 9 shows a section of the first and second bars 73 and 74. Reference character D' denotes the diameter of the first and second bars 73 and 74, reference character A' denotes the depth of the slots 73*a* and 74*a*, and reference character B' denotes the thickness of supporting portions 73*b* and 74*b*, of first and second bars 73 and 74, for supporting the load of the wafers W.

In the boat of the present invention, when the diameter of the wafers W is 200 mm, the diameter D' of the bars 73 and 74 is between 21 and 23 mm, preferably 22 mm. Here, the depth A' of the slots 73*a* and 74*a* is between 8.5 and 10.5 mm, preferably 9.5 mm, and the thickness B' of the supporting portions 73*b* and 74*b* is between 11.5 mm and 13.5 mm, preferably 12.5 mm. That is, the depth A' of the slots and the thickness B' of the supporting portions are increased by 2 mm and 0–2 mm, respectively, from those of the conventional boat.

It is preferable that the diameter of the first and second auxiliary bars 75 and 76 is 8 mm and the diameter of the supporting bars 77 is 5 mm.

Figure 10:
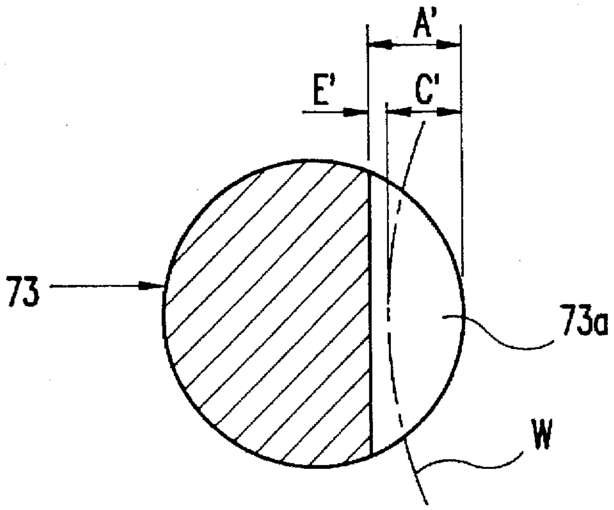
FIG. 10 is schematic view of the state where a wafer is placed in a slot of the first bar shown in FIG. 7.

FIG. 10 is a schematic sectional view of the state where the wafer W is placed in the slot 73*a* of the first bar 73, in the thus-structured boat of the present invention. In FIG. 10, reference character C' denotes the depth to which the wafer W is inserted into the slot 73*a*, reference character E' denotes the distance between the wafer W and the wall of the slot 73*a*. In the case of a 200 mm wafer, when the first bar 73 has the slot 73*a* wherein A' is 9.5 mm, the insertion depth C' of the wafer W is 7.5 mm and the distance E' is 2 mm. In other words, the insertion depth C' of the wafer W increases by 2 mm from that of the conventional boat, thereby providing more stable support for the wafer W.

Figure 11:
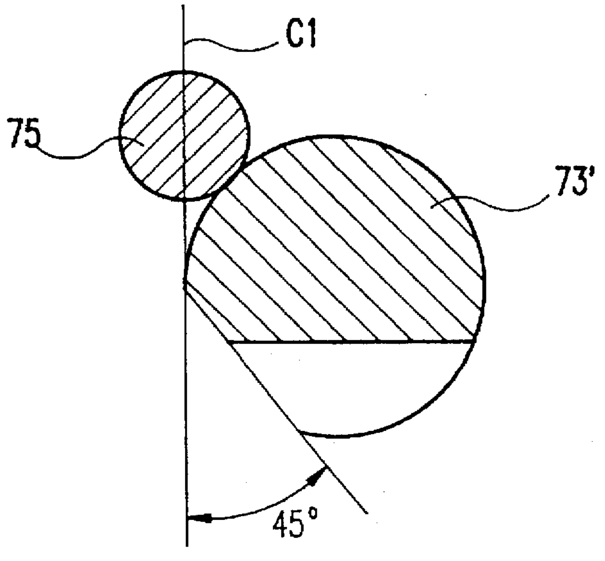
FIG. 11 is a sectional view of another embodiment of the second bar used for the boat shown in FIG. 7.

FIG. 11 is a sectional view of an example of a modified first bar, showing the positional relationship between the center plane C1 and the first auxiliary bars 75. As shown in FIG. 11, one portion of the modified first bar 73' is longitudinally cut to be placed at 45° with respect to the center plane C1.

This exemplary modification is intended to alleviate the load of the boat in consideration of the fact that the thermal deformation of the boat is sufficiently prevented by the first and second auxiliary bars 75 and 76, and the supporting bars 77.

To verify the effects of the present invention, thermal deformations of the conventional boat and the boat of the present invention were measured after heat treatment of a 200 mm wafer. Both boats were heated to 650° C. to 1050° C. for about 250 to 300 minutes and cooled to 650° C. This unit processing was repeated 25 times. For the boat of the present invention, a 22 mm diameter modified first bar 73' of FIG. 11, an 8 mm diameter first and second auxiliary bars 75 and 76, and three pairs of 5 mm diameter supporting bars were used.

Figure 5:
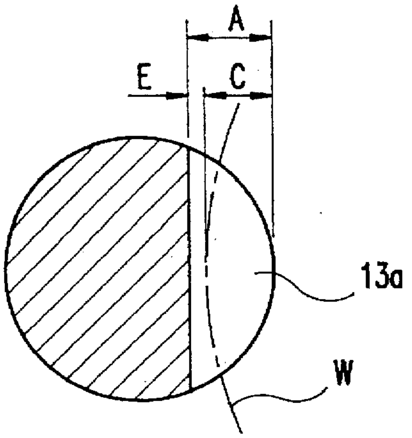
FIG.5 PRIOR ART
FIG. 5 is a schematic view of the state where a wafer is placed in a slot of the first bar shown in FIG. 4.
Figure 6:
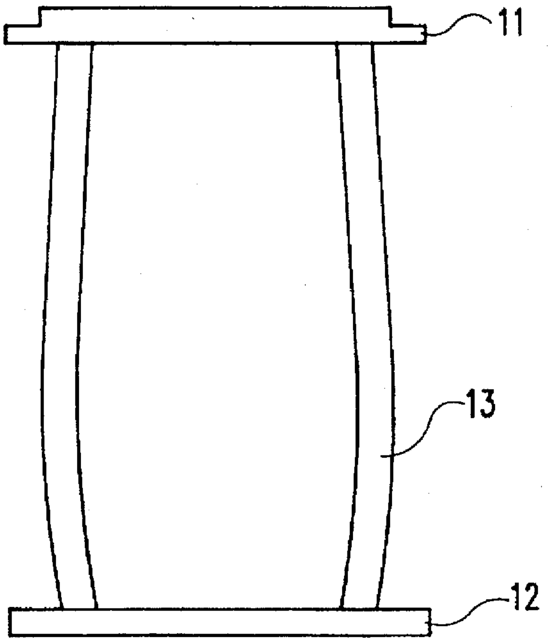
FIG.6 PRIOR ART
FIG. 6 is a schematic view of the first bar of FIG. 4 deformed by heat treatment.

As a result of the test, in the conventional boat, the insertion depth C. of the wafer W of FIG. 5 decreased from 5.5 mm to 2.0 mm, while the distance E increased from 2.0 mm to 5.5 mm due to the thermal deformation of the first bar 13 shown in FIG. 6. In contrast, in the boat of the present invention, since the first bar 73' was much less deformed than the first bar 13, the insertion depth C' of the wafer W decreased from 7.5 mm to 7.16 mm, and the distance E' increased from 2.0 mm to 2.34 mm.

In addition, the above unit thermal processing would have to be performed about 135 times to deform the first bar 73' as much as the first bar 13.

As described above, according to the boat of the present invention, since the first bar is thermally deformed only to a negligibly small degree, there is no concern about a wafer slipping out of a slot and the life of the boat can be prolonged.

While the present invention has been illustrated and described with reference to the above specific embodiment, it should be noted that this is an exemplary application. Thus, it is clearly understood that further modifications and alternations will occur to those skilled in the art, and this should be borne in mind when construing the scope of the claims which follow.

What is claimed is:

1. A boat for carrying semiconductor wafers and being suitable for use in a vertical diffusion furnace, comprising:

an upper disk and a lower disk spaced parallel from each other at a predetermined distance;

a pair of first bars connecting said upper disk and said lower disk, each of said first bars having a plurality of slots for receiving wafers, said pair of first bars being positioned at opposing ends of a first center plane extending along a diameter of said upper and lower disks;

a pair of second bars connecting said upper disk and said lower disk, each of said pair of second bars having a plurality of slots corresponding to said slots of said first bars, and each of said pair of second bars being positioned at a predetermined angle with respect to a second center plane orthogonal to said first center plane; and a pair of first auxiliary bars connecting said upper disk and said lower disk, each of said pair of first auxiliary bars being positioned adjacent to respective of said pair of first bars.

2. A boat for a vertical diffusion furnace as claimed in claim 1, wherein a diameter of said first and second bars is between 21 mm and 23 mm.

3. A boat for a vertical diffusion furnace as claimed in claim 1, wherein a diameter of said first and second bars is between 22 mm.

4. A boat for a vertical diffusion furnace as claimed in claim 2, wherein a depth of said slots is between 8.5 mm and 10.5 mm.

5. A boat for a vertical diffusion furnace as claimed in claim 2, wherein a depth of said slots is 9.5 mm.

6. A boat for a vertical diffusion furnace as claimed in claim 1, wherein the predetermined angle with respect to said second center plane is between 31° and 40°.

7. A boat for a vertical diffusion furnace as claimed in claim 1, wherein the predetermined angle with respect to said second center plane is 35°.

8. A boat for a vertical diffusion furnace as claimed in claim 1, further comprising a pair of second auxiliary bars, each being positioned adjacent to respective of said pair of second bars, for connecting said upper disk to said lower disk.

9. A boat for a vertical diffusion furnace as claimed in claim 8, wherein a diameter of said first and second auxiliary bars is 8 mm.

10. A boat for a vertical diffusion furnace as claimed in claim 8, further comprising at least one pair of horizontal supporting bars for connecting respective of said pair of first auxiliary bars and said pair of second auxiliary bars.

11. A boat for a vertical diffusion furnace as claimed in claim 10, wherein a diameter of said horizontal supporting bars is 5 mm.

12. A boat for a vertical diffusion furnace as claimed in claim 10, wherein a portion of each of said pair of first bars are longitudinally cut at a predetermined angle with respect to said first center plane.

13. A boat for a vertical diffusion furnace as claimed in claim 12, wherein the predetermined angle with respect to said first center plane is 45°.

* * * * *